United States Patent
Mortazavi et al.

[11] Patent Number: 5,838,515
[45] Date of Patent: Nov. 17, 1998

[54] PWM/LINEAR DRIVER FOR DISK DRIVE VOICE COIL ACTUATOR

[75] Inventors: Sassan Mortazavi, San Jose; Mehran Ataee, Cupertino, both of Calif.

[73] Assignee: Quantum Corporation, Milpitas, Calif.

[21] Appl. No.: 640,272

[22] Filed: Apr. 30, 1996

[51] Int. Cl.[6] .................................................. G11B 5/54
[52] U.S. Cl. .......................................... 360/78.12; 360/75
[58] Field of Search .................................. 360/67, 78.12, 360/77.04, 75, 78.09; 318/811, 594; 388/829, 828, 811

[56] References Cited

U.S. PATENT DOCUMENTS

| | | | |
|---|---|---|---|
| 4,743,815 | 5/1988 | Gee et al. ................................. | 318/254 |
| 4,914,644 | 4/1990 | Chen et al. ...................... | 360/78.09 X |
| 5,128,813 | 7/1992 | Lee ................................... | 360/78.06 X |
| 5,194,798 | 3/1993 | Hashimoto et al. .............. | 360/78.04 X |
| 5,204,594 | 4/1993 | Carobolante ............................ | 318/254 |
| 5,289,097 | 2/1994 | Erickson ................................ | 318/561 |
| 5,297,024 | 3/1994 | Carobolante ............................. | 360/67 |
| 5,307,439 | 4/1994 | Enami ..................................... | 388/811 |
| 5,309,078 | 5/1994 | Cameron ................................. | 318/811 |
| 5,369,345 | 11/1994 | Phan et al. ............................ | 360/78.09 |
| 5,450,521 | 9/1995 | Redlich ................................... | 388/829 |
| 5,455,496 | 10/1995 | Williams et al. ......................... | 360/75 |
| 5,517,095 | 5/1996 | Carobolante et al. ................... | 318/254 |
| 5,631,817 | 5/1997 | Minami ..................................... | 363/98 |
| 5,680,272 | 10/1997 | Kadlec et al. ....................... | 360/78.04 |

OTHER PUBLICATIONS

Data Sheet, TLS2204 Voice–Coil Motor Driver, Spindle Motor Driver, and Voltage Monitor Texas Instruments, Inc., Dallas, Texas, Oct. 1992.

*Primary Examiner*—Aristotelis M. Psitos
*Assistant Examiner*—K. Wong
*Attorney, Agent, or Firm*—David B. Harrison; Debra A. Chun; Robert V. Klauzinski

[57] ABSTRACT

A voice coil motor (VCM) driver has four field effect transistors connected to a motor coil as an H-bridge. A sense resistor in series with the coil and the H-bridge senses coil current. A feedback amplifier provides a feedback signal from a voltage developed across the sense resistor. A summing junction sums current command signals with the feedback signal. A transconductance loop compensation amplifier has an inverting input connected to the summing junction, has a non-inverting input connected to a reference level, and has an output control signal node. The control level is connected to control linear transconductance differential driver amplifiers including the four field effect transistors during a linear drive mode. A pulse width modulation (PWM) generator connected to the output control signal node generates variable duty cycle pulses related to the control level during a PWM drive mode applies the pulses to a first one of the four field effect transistors, and a polarity control circuit responds to a driving current direction signal by controlling another one of the four field effect transistors during the PWM drive mode.

18 Claims, 4 Drawing Sheets

PWM/LINEAR DRIVER FOR DISK DRIVE VOICE COIL ACTUATOR

FIELD OF THE INVENTION

The present invention relates to electronic amplifiers. More particularly, the present invention relates to an integrated circuit and control method for a disk drive voice coil actuator wherein the circuit operates in linear mode during track following and seek acceleration, and operates in pulse width modulation mode during seek deceleration, in order to minimize heat generation within the integrated circuit.

BACKGROUND OF THE INVENTION

Contemporary hard disk drives typically include a brushless DC motor within a rotating disk spindle assembly for rotating at least one data storage disk at a desirable velocity, typically in a range between 5000 and 10,000 revolutions per minute. Given a constant rotational mass, the faster the spindle rotates, the more driving power is required to drive the motor.

Disk drives also typically include a rotary actuator structure powered by a voice coil motor. The rotary actuator structure positions one or more slider head assemblies at desired locations relative to surfaces of the disk or disks. Voice coil motors (VCMs) typically include a flat molded coil rotatably positioned within an intense magnetic field provided by powerful permanent magnets. Current passing through the coil is translated into mechanical force which moves the actuator assembly from one track position to another track position during track seeking operations. These operations are carried out by a head positioner servo loop which applies forward and reverse currents through the voice coil in accordance with a track seek trajectory or profile. Less current is required to maintain the actuator assembly at a desired location at which the head or heads are positioned and maintained over track locations, during what is known as track following operations.

In an ongoing trend toward miniaturization and reduced costs driving circuits including power field effect transistors (DMOS) for driving the DC brushless spindle motor as well as for driving the VCM are typically defined as a single custom motor driver application specific integrated circuit (ASIC) chip. Motor driver ASICs of this type have an advantage of relatively small size, and have a related disadvantage of reduced relative heat dissipation capability. High currents during track seeking operations generate internal heating within the DMOS transistors within the chip used to drive the VCM. Appropriate steps are taken in order to limit the high currents and consequent heating, otherwise leading to chip failure, with consequent degraded track seek time performance.

DMOS power transistors are electrically similar to NMOS power FETs. The electrical resistance of a DMOS transistor channel between source and gate electrode typically goes up as a function of increasing temperature. Heretofore, a typical VCM driver circuit, comprising an H-bridge, has been operated in linear mode. It has been discovered that most of the power dissipation in linear mode VCM drivers occurs in the deceleration phase of track seeking when back EMF developed during the seek operation adds to supply voltage, thereby increasing the voltage drop across each transistor channel of the H-bridge driver.

It is known that DMOS power transistors are particularly well suited to act as switches, and it is known to operate these devices in switching mode as well as in constant-current linear mode. Switching duty cycle is varied in accordance with a control or error parameter, with overall current maintaining a desired shape by averaging. Variable duty cycle switching is most frequently referred to as pulse width modulation (PWM). With PWM a control signal applied to a control gate electrode of the DMOS transistor is a logical pulse having a controlled duration or duty cycle.

One advantage of PWM mode is that the DMOS transistor resistance (and drain/source voltage drop) is kept low with high instantaneous driving currents. A resultant disadvantage is that the pulses of PWM create high frequency spectral components which can interfere with sensitive read channel electronics connected to the head transducer. Filtering of these components is difficult, because the components tend to vary in accordance with switching frequency. While servo loops which rely on position information from the disk surface during track seeking are most frequently employed in modern disk drive designs, the servo information is typically recorded in a format which is considerably more robust than user data information, and interference from PWM mode can be tolerated. Such interference is not significantly present during track following mode, when the PWM driver is operated in a linear, constant current mode, and user data is being read back from the data track being followed by the head transducer assembly.

One significant difficulty in realizing a practical dual-mode VCM driver circuit is to provide a transconductance loop which minimizes step disturbance when the loop is switched between linear mode and PWM mode, so that there is no net change in position of the actuator structure when PWM mode is left at the end of a seek deceleration trajectory and the VCM driver enters linear mode more suited for track settling and track following operations.

A heretofore unsolved need has remained for a dual mode VCM driver which minimizes internal heating during seek deceleration by operating in PWM mode and which switches to linear mode for track following without creating a step force disturbance.

SUMMARY OF THE INVENTION WITH OBJECTS

A general object of the present invention is to provide dual mode motor driver circuit for a voice coil motor which overcomes limitations and drawbacks of prior approaches.

Another object of the present invention is to provide a dual motor driver integrated circuit chip, in which one of the integral motor drivers is a dual mode driver capable of switching between PWM mode and linear mode without a resultant step force disturbance in the motor being driven.

Another object of the present invention is to provide an improved motor driver integrated circuit chip for a disk drive, including a disk spindle motor driver, a dual mode VCM driver, and an interface from a digital signal control path of the disk drive.

A further object of the present invention is to provide an improved PWM/linear mode motor driver circuit for a VCM which uses a single transconductance loop compensation amplifier for both modes to minimize step disturbance.

One more object of the present invention is to normalize gain and bandwidth of a transconductance loop by providing clamped control levels within a dual mode VCM driver circuit in order to minimize step disturbances otherwise resulting during switching between linear and PWM operating modes.

In accordance with one aspect of the present invention, a motor driver circuit is provided for driving a motor having a coil in a linear mode and in a PWM mode with minimized step disturbance during switch over between linear and PWM modes. The driver circuit comprises:

a motor driver input for receiving a motor control signal, a loop compensation amplifier having an inverting input connected to receive the motor control signal from the motor driver input, having a non-inverting input connected to a reference level, and having a loop compensation output providing a control voltage, a differential amplifier pair having a common input connected to the loop compensation output during linear mode and having two outputs connected in series with the coil and a current sense resistor, each amplifier pair including a current source transistor connected to source current from a supply voltage and a current sink transistor connected to sink current to a ground return path, a feedback amplifier having inputs connected across the sense resistor and having an output connected to the inverting input of the loop compensation amplifier, a pulse width modulation (PWM) generation circuit connected to the loop compensation output for generating variable duty cycle pulses related to the control voltage during a PWM drive mode and for applying the pulses to control elements of a source or sink one of the transistors, and a polarity control circuit responsive to a driving current direction signal during PWM mode for applying a current direction control signal to control elements of a sink or source other one of the transistors.

In this aspect of the invention the PWM generation circuit may comprise a sawtooth oscillator circuit for generating a sawtooth waveform, a full wave rectifier connected to the loop compensation output for rendering the control voltage as an absolute value, and a first comparator connected to compare the absolute value with the sawtooth waveform so as to generate a PWM control for directly controlling e.g. the source pair of transistors during PWM mode.

In this aspect of the invention the polarity control circuit may comprise a second comparator connected to compare the control voltage with the reference level, and having a control output, and an inverter means connected to invert the control output to provide an inverted control output, the control output and the inverted control output being connected to the control elements of e.g. the sink pair of transistors during PWM mode.

As another, related aspect of the invention, a disk drive comprises a storage disk rotated by a disk spindle motor and a voice coil actuator operated by a voice coil actuator motor (VCM). The VCM has a single coil. The drive includes a motor driver chip having control interface for receiving motor control values from drive electronics and for thereupon generating driving signals for operating the spindle motor with a motor driver and current command signals for operating the VCM with a VCM driver. In this aspect of the invention, the VCM driver comprises:

four field effect transistors connected to the coil as an H-bridge, a sense resistor in series with the coil and the H-bridge for sensing coil current, a feedback amplifier for amplifying voltage developed across the sense resistor to provide a feedback signal, a VCM driver summing junction for summing current command signals with the feedback signal, a transconductance loop compensation amplifier having an inverting input connected to the VCM driver summing junction, having a non-inverting input connected to a reference level, and having an output control signal node, for providing loop compensation to a control level at the output control signal node, the control level being connected to control linear transconductance differential driver amplifiers including the four field effect transistors during a linear drive mode, pulse width modulation (PWM) generation circuitry connected to the output control signal node for generating variable duty cycle pulses related to the control level during a PWM drive mode and for applying the pulses to control elements of a first one of the four field effect transistors, and polarity control circuitry responsive to a driving current direction signal for applying a control level to control elements of a second one of the four field effect transistors during PWM drive mode.

As one further aspect of the present invention, a method is provided for controlling a voice coil actuator motor (VCM) having a single coil with a VCM motor driver chip within a disk drive, the motor chip including a control interface and an H-bridge driver for generating driving signals for operating the VCM. The method comprises the steps of:

receiving and decoding VCM control values from disk drive electronics via the control interface, operating the H-bridge driver circuit in a linear mode during track following operations and during an acceleration phase of track seeking operations, switching the H-bridge driver circuit from linear mode to pulse width modulation (PWM) mode at a commanded time to begin a deceleration phase of track seeking operations, operating the H-bridge driver circuit in pulse width modulation (PWM) mode during a deceleration phase of track seeking operations, and switching the H-bridge driver circuit from PWM mode to linear mode at an end of the deceleration phase.

In this further aspect the method may comprise further steps of:

sensing VCM current at a sense resistor in series with a voice coil of the VCM, amplifying the sensed VCM current to provide a loop error value, combining the loop error value with decoded VCM control values at a loop compensation amplifier to produce a compensated control value, and applying the compensated control value to control the H-bridge driver during linear mode operations.

These and other objects, advantages, aspects and features of the present invention will be more fully understood and appreciated by those skilled in the art upon consideration of the following detailed description of a preferred embodiment, presented in conjunction with the accompanying drawings.

DETAILED DESCRIPTION OF THE PREFERRED EMBODIMENT

Figure 1:
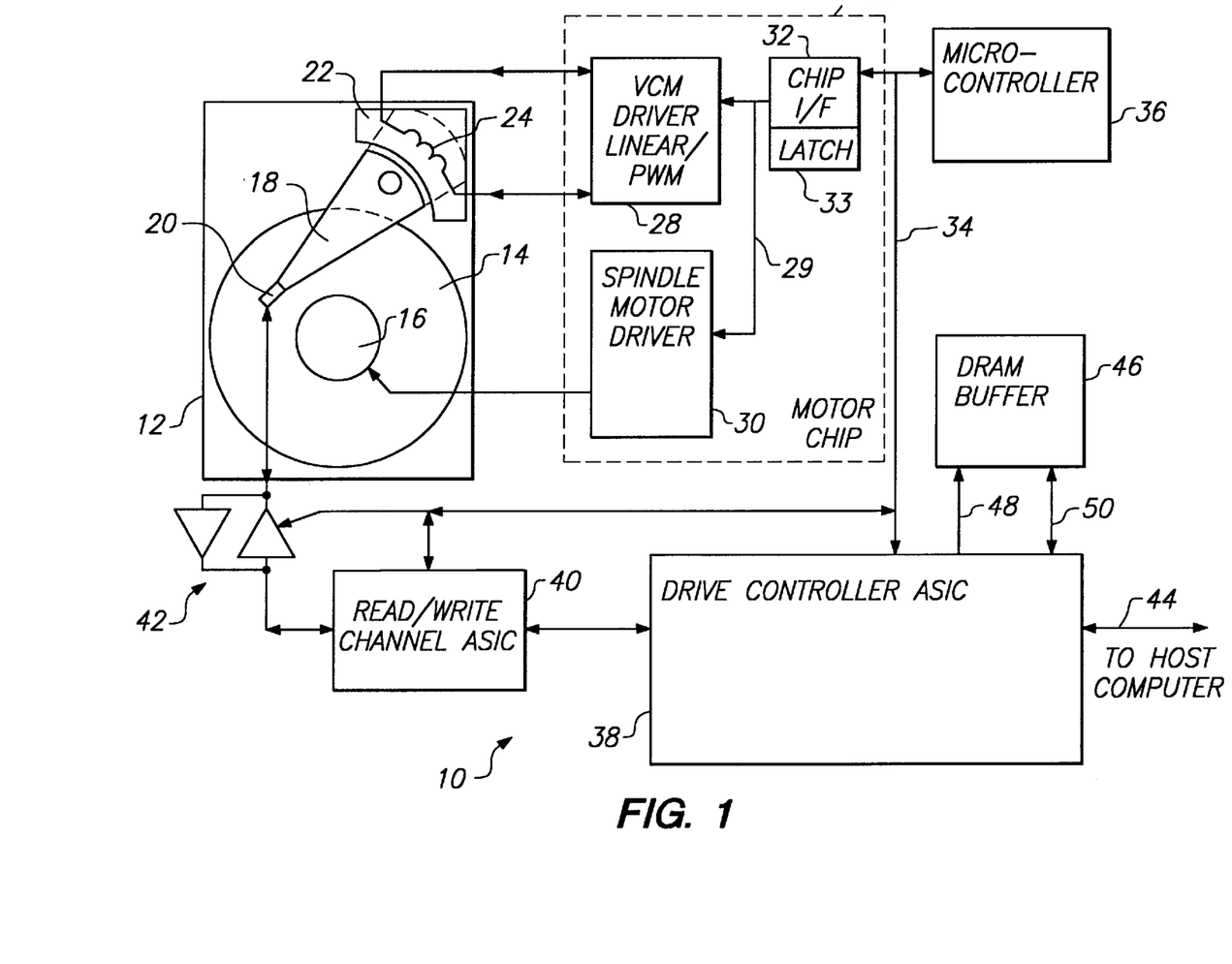
FIG. 1 is a summary block diagram of a disk drive including a motor chip having a dual mode voice coil driver circuit in accordance with principles of the present invention.

Before discussing details of an embodiment of the present invention, a brief description of an intended usage environment is presented. A hard disk drive 10 includes a base or frame 12. At least one data storage disk 14 is rotatably mounted to the base 12 by a spindle motor assembly 16. A head positioner 18 has a journal bearing to the base 12 and includes a data transducer head 20 which is positioned relative to the data storage disk 14 by a voice coil motor assembly 22 including a rotary voice coil 24.

The disk drive 10 also includes a motor chip 26 including a voice coil motor (VCM) driver 28 which operates in both linear and PWM modes in accordance with principles of the present invention. The motor chip 26 also includes a spindle motor driver 30, and a motor chip interface 32. The motor chip interface 32 connects to an internal control signal path 29 interconnecting the spindle motor driver 30 and VCM driver 28, and the interface 32 also extends to an external drive control bus structure 34. The drive bus structure 34 leads to and interconnects a disk drive microcontroller 36, a disk drive controller application-specific integrated circuit (ASIC) 38, a read/write channel chip 40, and a read preamplifier/write driver 42. While a single bus structure 34 is illustrated in the simplified drive architectural overview of FIG. 1 it will be apparent to those skilled in the art that the bus 34 preferably comprises both serial and parallel data control paths. A serial control path is preferred for the chip interface 32, and for the read/write channel ASIC and preamplifier/write driver 42.

The drive controller ASIC 38 internally includes an interface structure leading to a bidirectional data/address/control bus structure 44 enabling the drive 10 to be connected to a host computer (not shown). The drive controller ASIC 38 also includes a buffer memory controller for controlling e.g. cell refresh and data transfers to and from a dynamic random access memory (DRAM) cache buffer chip 46. Buffer refresh signals and addresses are presented over a local address bus 48, while data values are passed back and forth over a bidirectional local data bus 50.

When the host computer requests data access, either to store or retrieve a block of data to or from disk 14, the host command is received and decoded in the drive controller ASIC or by the micro-controller 36. The micro-controller 36 converts a logical data block address into a physical cylinder, head and sector location (cylinder and head specifying a data surface track location, and sector specifying a block location within the specified track). The micro-controller generates a digital control value which is passed over the bus 34 and through the motor chip interface 32 to the VCM driver circuit 28 which causes the head 20 to be moved from a departure track to a destination track. Embedded servo sectors are read during the resulting head seek trajectory, and the head 20 is settled onto the destination track while the disk 14 is rotated and presents the desired sector to the head. Data is then written to the disk 14 or is read from the disk. The data is temporarily stored in the cache buffer 46, and multiple data block transfers are frequently made via the buffer 46 during transfer of data between the drive 10 and the host computer.

Within the described architecture of the disk drive 10 it is important to note that the circuit elements 26, 36, 38, 40 and 46 are conventionally mounted on and connected by a printed circuit board affixed to the base 12. It is likewise important to note that the motor chip 26 integrally contains motor driver transistors which typically pass considerable currents, both to the spindle motor 16, and to the VCM 24. Accordingly, managing and dissipating thermal heating within the chip 26 becomes a very important design consideration and potential drive performance limitation.

Most of the power dissipation in linear voice coil motor drivers occurs in a deceleration phase of the seek trajectory. The present invention reduces the power dissipation in the motor chip 26 by switching the VCM driver 28 from linear mode into PWM mode at onset of a deceleration phase of the seek trajectory. As the actuator 18 moves the head 20 toward the intended destination track, the VCM driver 28 is switched back to linear mode. The linear mode of operation contributes considerably less noise to the read channel 40 than the PWM mode of operation. While the read channel remains active to read embedded servo identification fields during deceleration mode, the signals presented in the servo sectors are considerably more robust and readable than user data signals recorded in a track. Therefore, reduced power dissipation is achieved without sacrificing signal-to-noise ratio in the read channel. A further design challenge lies in minimizing step disturbance (current transients) in the voice coil motor 22 when switching from PWM mode to linear mode, and vice versa. This challenge has been met in the present invention by reducing the magnitude of the step disturbance, maintaining a high transconductance loop bandwidth, and minimizing phase margin degradation due to sampling.

Figure 2:
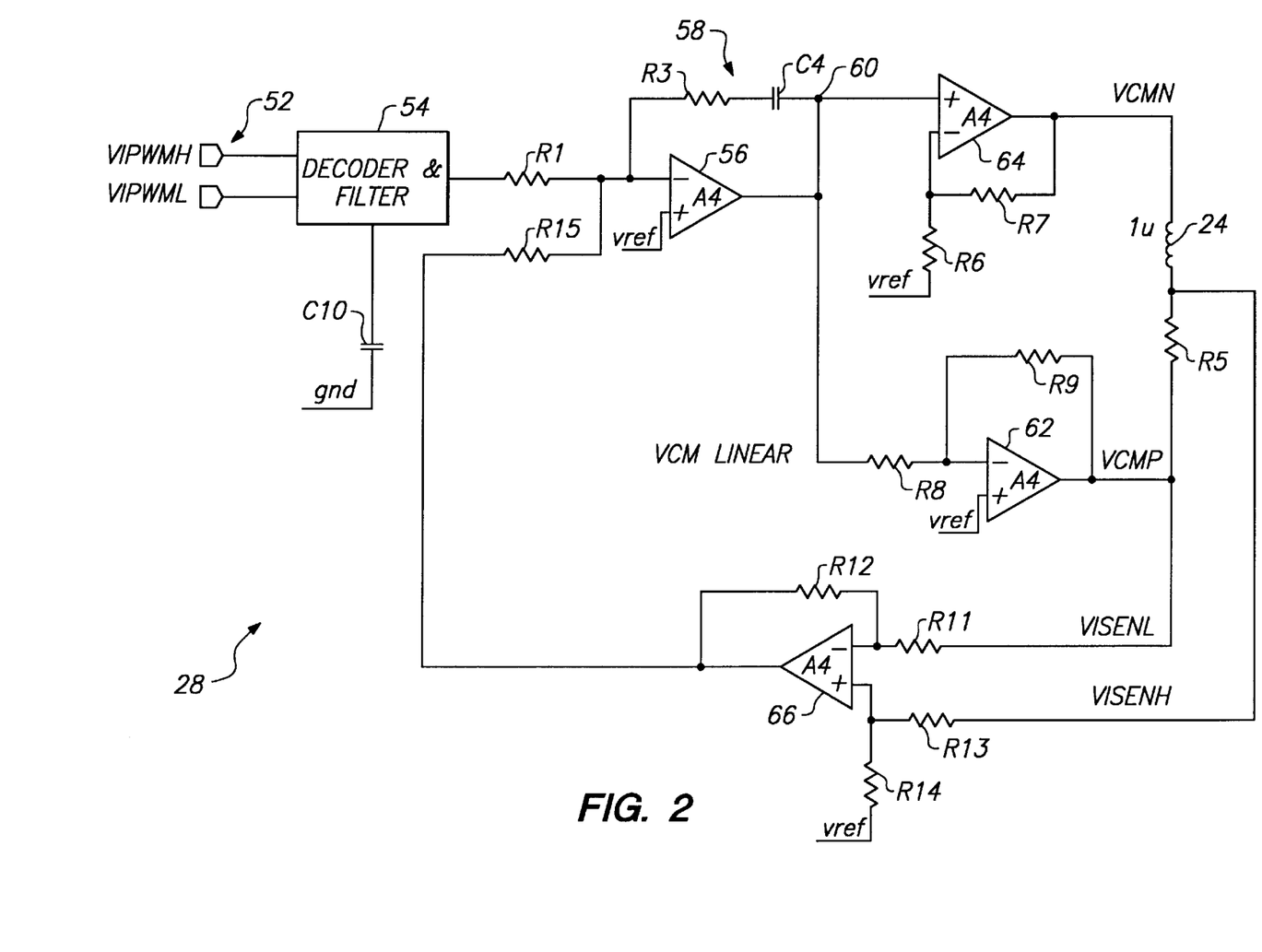
FIG. 2 is an electrical block and schematic diagram the dual mode voice coil driver circuit of FIG. 1 operating in linear mode.

FIG. 2 sets forth the VCM driver circuit 28 in linear mode. The driver circuit 28 is configured as a classical linear transconductance amplifier in which a signed control voltage results in a directional continuous current flow through the voice coil 24. The driver circuit 28 includes an input 52 for receiving digital control values from the microcontroller 36 via the interface 32 and internal bus 33 within the motor chip 26. A decoder and filter 54 functions to convert the digital control values into a filtered analog control voltage. That voltage is passed through a resistor R1 into an inverting input of a loop compensation amplifier 56, resulting in a current at an output node 60. A non inverting input of the amplifier 56 is tied to a reference voltage Vref. A feedback network 58 from an output node 60 and comprising a capacitor C4 and a resistor R3 establishes the compensation amplifier 56 as an integrator and provides suitable loop phase margin during both linear and PWM control modes. The feedback network 58 essentially establishes the bandwidth of the transconductance loop of VCM driver circuit 28.

A control voltage at control node 60 is applied through series resistor R8 to an inverting input of a driver 62. A non-inverting input is connected to the reference voltage Vref. A feedback resistor R9 from the output of the driver 62 to the inverting input sets the gain of the driver 62 in accordance with R8/R9. Driver output is arbitrarily labeled as a positive current terminal VCMP and is applied through a series current sense resistor R5 to the voice coil 24. A negative current terminal VCMN is provided by a second transconductance driver 64. A non inverting input of the driver 64 is connected to the control node 60, while the inverting input is connected to the reference voltage Vref through a series resistor R6. A feedback resistor R7 connects from the negative current terminal VCMN to the inverting input of the driver 64. Drivers 62 and 64 differentially drive the voice coil motor 22, and actual polarity at the nodes VCMP and VCMN is determined by the direction of differentially commanded current flow. The magnitude of the gain of the drivers is in accordance with:

$$GA62 = GA64 = R9/R8 = 1 + R7/R6. \qquad (1)$$

Preferably, gain of the drivers 62 and 64 is set to be 3, meaning that feedback resistor R9 has three times the resistance of resistor R8, and feedback resistor R7 has twice the resistance of resistor R6. With the arrangement shown in FIG. 2, differential gain of amplifiers 62 and 64 is 6. For example, if the power supply provides 12 volts, and the driver reference voltage Vref is 6 volts, a plus or minus 2 volts as input results in plus or minus maximum current through the motor coil 24. The output control voltage from the compensation amplifier 56 is in accordance with:

$$Voc = (VCMN - VCMP)/(2*R9/R8), \qquad (2)$$

where VCMN−VCMP is the voltage across the motor coil 24, and where the factor "2" represents the fact that voltage is applied differentially to the motor 22.

Current passing through the coil 24 interacts with permanent magnet fields established by a permanent magnet stator structure of the motor 22 to apply a directional rotational force upon the head positioner structure 18, direction of force being directly related to direction of current passing through the coil 24.

By inspection it is apparent that the same current passing through the motor coil 24 will also pass through current sense resistor R5, resulting in a voltage proportional to the current in accordance with Ohm's law. This bidirectional current is sensed by a current sense amplifier 66 via a resistor R11 in series with an inverting input, and a resistor R13 in series with a non-inverting input. The non-inverting input of amplifier 66 is connected to the reference voltage Vref through a resistor R14, while an output from the amplifier 66 is fed back to the inverting input through a gain-setting resistor R12 which establishes gain of the amplifier 66 in accordance with R12/R11. The current sense output of the amplifier 66 feeds back to the inverting input of the compensation amplifier 56 through a series resistor R15. The amplifier 66 serves to close the transconductance loop through the motor coil 24.

Motor current Im through the coil 24 is as follows:

$$Im = (VCMN - VCMP)/(LS + Rtotal), \qquad (3)$$

where
L=motor inductance
S=ω=(2πf)
Rtotal=sum of coil R (of coil 24) and sense resistor R5.
When equation (3) is substituted into equation (2), equation (2) becomes $$Voc = (Im*(LS + Rtotal))/(2*R9/R8). \qquad (4)$$

If the gain term (2*R9/R8) in the linear mode can be duplicated in the PWM mode, the bandwidth of the transconductance loop will be the same as in the linear mode. In addition, if the voltage at the output control node 60 of the compensation amplifier 56 can be held constant during switch over from linear to PWM, and vice versa, the step disturbance will be theoretically zero. While it is not possible to realize a driver circuit with zero step disturbance, the approach explained herein will minimize this disturbance.

Control of switch over from linear mode to PWM mode is managed by the micro-controller 36 operating within a head position servo control loop. Each seek from a departure track location to a destination track location follows a known seek profile. Most preferably, full current is applied to the coil 24 during acceleration mode, such that the driver amplifiers 62 and 64 are operating in saturation. After actuator acceleration has resulted in a velocity driving the actuator structure 18 to approximately a midpoint between the departure track and the destination track, deceleration mode is commanded. To implement deceleration mode, the microcontroller 36 writes a PWM control value into the latch 33 of the chip interface 32. This value is decoded within the chip 26 and used to switch over to PWM mode at the beginning of deceleration, and another control is written to the latch 33 by the microcontroller 36 to control switch back to linear mode later in the deceleration mode when the back EMF has dissipated, and the head positioner assembly 18 is settling at the vicinity of the destination track. In this regard, it is preferable to leave PWM mode and return to linear mode before the track settling operation, so that there will not be any electrical interference to the read channel electronics 40, 42 as the servo position information needed for track settling and on-track alignment is read from the disk 14 by the transducer 20.

It should be noted here that for very short seeks of one up to several tracks, PWM mode will not be employed, because very little back EMF will be generated in moving the actuator structure 18 over a very small radial distance representing a single track seek or a seek over several adjacent tracks. The present invention solves the problem of what to do with the back EMF generated by the actuator coil 24 during extended seeks, and how to dissipate the stored energy of the moving actuator structure 18 without burning out the power transistors comprising the H-bridge driver through excessive heat generation.

Figure 3:
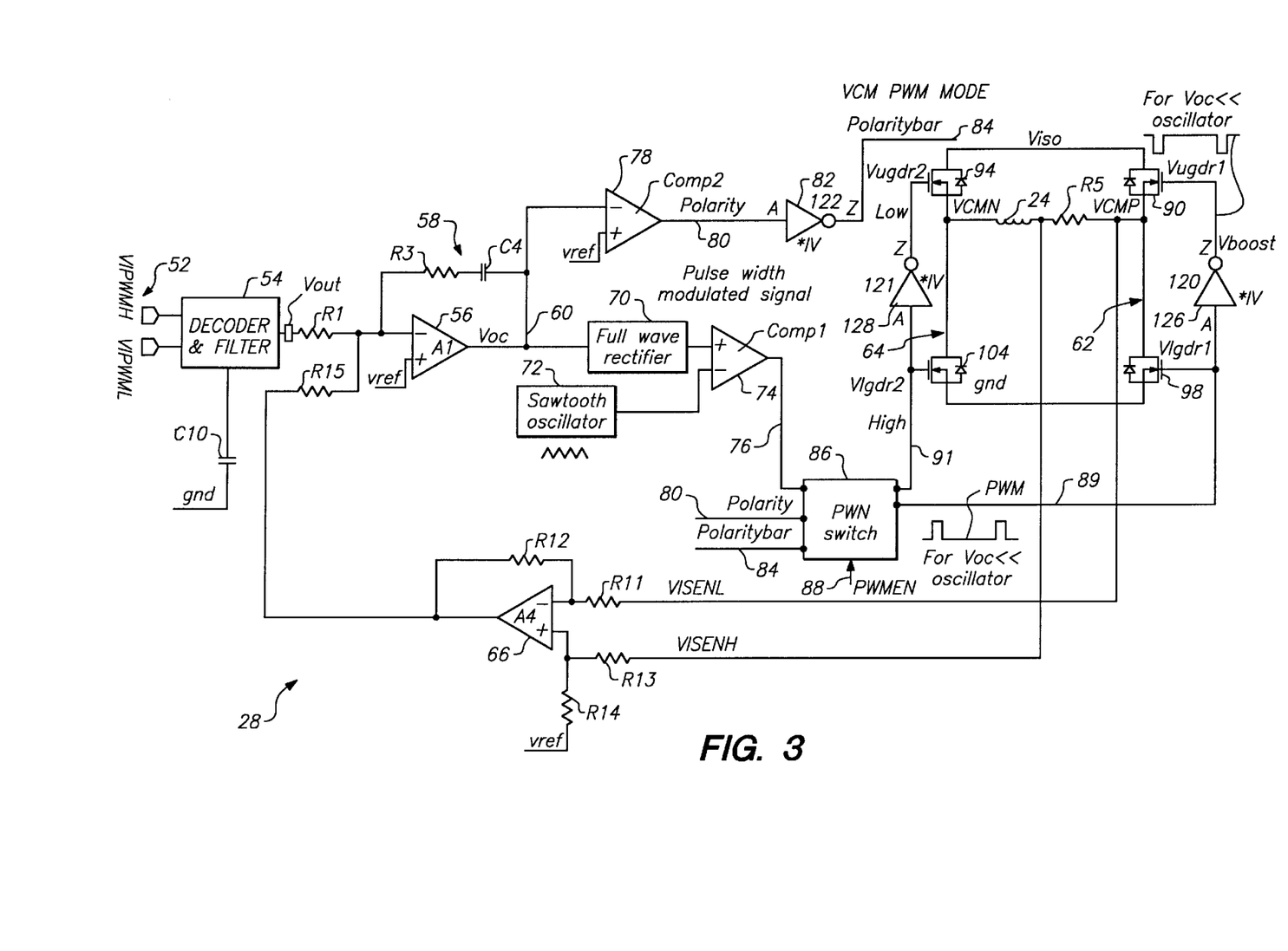
FIG. 3 is an electrical block and schematic diagram of the dual mode voice coil driver circuit of FIG. 1 operating in PWM mode.

FIG. 3 illustrates a preferred implementation of the present invention. In FIG. 3 the driver circuit 28 is redrawn for PWM mode. The PWM mode illustrated in FIG. 3 relies upon rectification of the control voltage Voc in order to obtain an absolute value thereof. The absolute value control is then translated into a PWM signal by being compared to a locally generated sawtooth waveform. The PWM control signal is then applied directly to control output FET driver transistors of the amplifiers 62 and 64. In the FIG. 3 illustration the circuit elements which remain unchanged in structure and function from the linear mode of the circuit 28 depicted in FIG. 2 have the same reference numerals, and the previous descriptions of those elements will apply, subject to the following discussion.

In the linear mode any increase or decrease in the voltage Voc at node 60 with respect to the reference Vref increases the magnitude of the current in the motor. The control voltage Voc represents a differential control voltage having a mean value equal to the reference voltage. If Voc is above Vref by some amount, a proportional current flow in one direction occurs through the amplifiers 62, 64 and coil 24, and the actuator 18 will move in one direction relative to the disk 14. If Voc is below Vref by some amount, a proportional current flow in a reverse direction occurs through the amplifiers 64, 62 and coil 24 and the actuator 18 will move in an opposite direction relative to the disk 14.

The Voc control voltage at control node 60 is rectified by a full wave rectifier 70 which removes the sign of the control voltage at the control node 60. A sawtooth oscillator 72 generates a sawtooth waveform having an absolute peak to peak magnitude which is made to be the same as the clamping voltage at the compensation amplifier 56, or:

$$|\text{sawtooth magnitude}| = \frac{Viso}{2 * \frac{R8}{R9}}.$$

The absolute value (full-wave rectified) control voltage derived from Voc is compared in a comparator circuit 74 to the sawtooth waveform from the oscillator 72. The comparator 74 puts out a variable duty cycle PWM control voltage onto a PWM control output path 76. If the absolute value of Voc is at a maximum level, a full duty cycle occurs. If the absolute value of Voc is at a zero level, meaning that the integral of the difference between the Vout signal at the output of the decoder and filter 54 and the feedback control signal at the output of comparator 66 is zero, the PWM duty cycle will be zero.

As the absolute magnitude of the control voltage changes with respect to the sawtooth waveform from oscillator 72, the duty cycle of the PWM control pulse on path 76 changes. This change is illustrated in examples given by FIGS. 4A and 4B. In the FIG. 4A example, the absolute magnitude of Voc is high with respect to the magnitude of the sawtooth waveform, and a very large relative duty cycle (high level versus low level) of the PWM control voltage results. A contrary situation obtains in the FIG. 4B example, where the absolute magnitude of Voc is low relative to the sawtooth waveform, and a relatively small duty cycle of the PWM control voltage on path 76 results. As suggested by the FIGS. 4A and 4B examples, the duty cycle of the PWM control signal can vary from 0% to 100%.

The requisite current polarity through the voice coil 24 can be determined two ways. One way to determine the polarity is to have the micro-controller 36 issue a seek direction command, as well as a current magnitude command, when seek deceleration (PWM mode) is commanded via the serial port interface 32 and held in a latch 33. A second way which is preferred in the present example is to provide a second comparator 78 to compare the compensator output control voltage Voc at node 60 to the reference voltage Vref to yield a polarity signal on an output path 80. The polarity signal passes through an inverter 82 to produce a negative polarity control signal (polarity bar) on a path 84.

As shown in FIG. 3, the output driver FET transistors of the amplifiers 62 and 64, arranged as an H-bridge driver, are directly controlled in PWM mode. The amplifier 62 contains a current source transistor 90 and a current sink transistor 98. The amplifier 64 contains a current source transistor 94 and a current sink transistor 104. Supply potential Viso is applied to the source transistors 90 and 94, while a ground return is connected by sink transistors 98 and 104.

The PWM signal put out on the path 76 is switched to a particular driver transistor within one of the amplifiers 62 or 64 by a switching circuit 86. The switching circuit 86 is responsive to the polarity signal on path 80 and the polarity bar signal on path 84. Also, the switch 86 is enabled by a PWM mode enable signal on a control path 88. There are two control paths 89 and 91 leading from switching network 86. One path 89 leads directly to a gate control element of sink transistor 98 within amplifier 62, whereas another path 91 leads directly to a gate control element of a sink transistor 104 in amplifier 64. Inverters 126 and 128 respectively invert the control signals at the gates of transistors 98 and 104, and provide the inverted control signals to the gates of source transistors 90 and 94.

A boosted control voltage Vboost is provided to the gate control electrode of the transistor 90 because it is an enhancement mode device. Vboost is used at the control electrodes of source transistors 90 and 94 during both linear and PWM modes. The PWM mode driving arrangement shown in FIG. 3 could be reversed, with the PWM signal controlling the source transistors 90 and 94, and with Viso voltage being applied to control the sink transistors 98 and 104 (Vboost being required for the source transistors 90 and 94, but not being required for the sink transistors 98 and 104 for reasons explained hereinafter).

The PWM mode control conditions applied to the output driver transistors cause the same average current to flow through the motor coil 24 as in the linear mode, although with a controlled duty cycle. A resultant current flows through the coil 24, either in the forward or reverse direction, causing a reaction force to be applied to the head positioner 18 during seek deceleration in order to stop the head relative to the disk at a desired track location in the shortest practical time with minimum heat being generated within the motor chip 26.

In PWM mode the motor current Im in accordance with the following:

$$Im = (\text{rectification gain} * \text{voltage to pulse width modulation} * \text{supply voltage})/(LS+Rtotal) \quad (5)$$

With a rectification gain of unity, the voltage to pulse width modulation*supply voltage term equals the average applied voltage to the motor. From Fourier analysis, the average applied voltage is equal to C0, which is equal to (Vsupply*pulse width)/(period).

Step disturbance otherwise arising when switching from PWM mode to linear mode, and vice versa, is minimized by establishing an active clamp level proportional to voltage supply Vsupply at the compensation amplifier 56. The clamp voltage is designed to be:

$$Vclamp = (Vsupply)/(2 * R9/R8)$$

The magnitude of the clamp voltage is just enough to place the output drivers 90, 94, 98, 104 into a triode transfer characteristic region and command maximum current through the motor in the linear mode. Therefore, Voc=Vref+/−Vclamp provides 100% current through the motor 22.

The clamp voltage Vclamp is made proportional to the supply voltage. For example, if (2*R9/R8)=6 and Vsupply= 12 volts, then the clamp voltage Vclamp would be Vclamp= 12v/6=2 volts and the compensation amplifier voltage Voc at node 60 would be Voc=Vref+/−Vclamp=6+/−2 volts. In another example, if Vsupply equals 13.2 volts, Vclamp would be Vclamp=13.2/6=2.2 volts. The same holds for a Vsupply of 10.8 volts where Vclamp would be 10.8/6=1.8 volts.

Figure 4A:
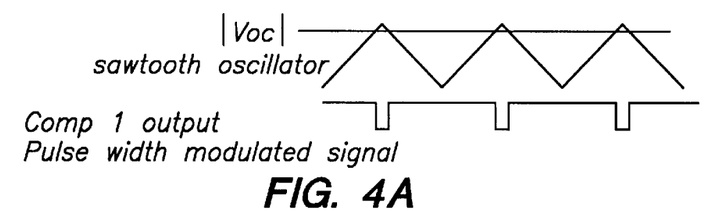
FIGS. 4A and 4B are two series of three waveform graphs drawn along a common horizontal time base, illustrating principles of operation of the dual mode voice coil driver circuit of FIG. 1 while operating under two conditions in the FIG. 3 PWM mode.
Figure 4B:
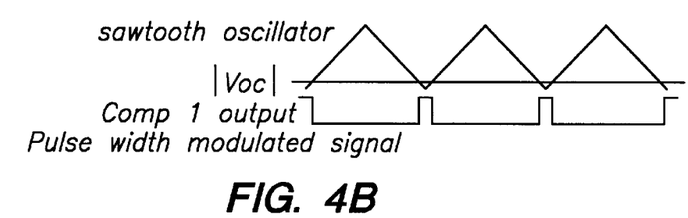

The voltage swing of the fixed frequency sawtooth oscillator 72 is designed to be exactly the same as the clamp voltage Vclamp. For example, if the clamp voltage Vclamp is 2 volts, Vsupply is 12 volts, Vref is 6 volts, and PWM oscillator magnitude is 2 volts, the voltage swing would be from Vref to Vref−Vclamp, or 6 volts to 4 volts. Since the oscillator magnitude is the same as the clamp voltage Vclamp in the PWM mode of operation, Voc=Vref corresponds to zero current through motor coil 24, whereas Voc=Vref−Vclamp corresponds to 100% PWM duty cycle. Any voltage between Vref and Vref−Vclamp changes the PWM duty cycle in a linear fashion. Thus, when operation of VCM driver 28 is changed from linear mode to PWM mode, there will be no step disturbance in the transconductance loop. In other words, for a given control voltage Voc at node 60, the current through the motor coil 24 remains the same regardless of whether the driver 28 is operating in the linear mode (FIG. 2) or in the PWM mode (FIGS. 3, 4A and 4B).

Figure 5A:
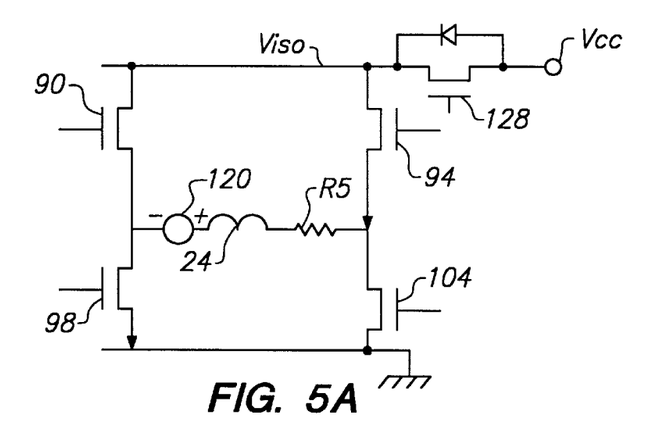
FIGS. 5A and 5B are functional schematics of an H-bridge driver circuit, FIG. 5A illustrating a current flow path during linear mode, and FIG. 5B illustrating PWM mode primary and secondary current flow paths.
Figure 5B:
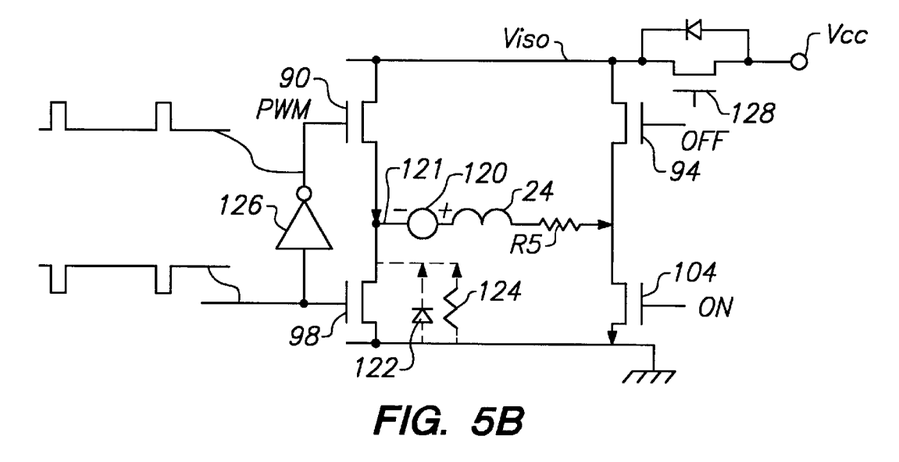

Aspects of the present invention may be further understood and appreciated by considering FIGS. 5A and 5B. FIG. 5A illustrates a current flow path through the FIG. 3 H-bridge driver during an acceleration phase (linear mode) for a sizable track seek operation, e.g. 100 tracks. DMOS devices 94 and 98 are turned fully on, so they are conducting maximum current (on a path shown in bold line, and in a direction shown by the arrow heads) through the coil 24 and the sense resistor R5. Because the actuator coil is accelerating through a field, a voltage source 120 is shown which represents the back EMF induced in the coil.

Since current lags voltage through an inductor, when voltage is first applied to the coil 24, the current is zero, but rapidly builds exponentially in accordance with a time constant established by the inductance of the coil 24, coil resistance and sense resistance R5. After the current reaches a maximum value, it begins to decay due to build up of back EMF of the source 120. As the back EMF builds up, it subtracts from the isolation voltage (Viso) applied across the coil by the closed DMOS FET switches 90 and 104. As the head structure 18 continues to accelerate, the back EMF continues to build up, limiting voltage and acceleration, until a switch over point, determined by microcontroller 36, is reached, e.g. as the 50th track is crossed by the actuator structure 18 in this example of a 100 track seek.

Frequently, host system designers who incorporate hard disk drives into systems which supply primary operating power to the disk drives, impose certain maximum current limits upon disk drive operation.

Assume in the present example that the power supply Vcc will supply 12 volts at 1.5 amps for actuator power during acceleration phase (over and above other power demands of the disk drive 10). If 1.5 amps is used for acceleration phase, then 1.5 amps will be available during deceleration phase, or maybe slightly more, depending upon power supply tolerances.

During acceleration phase and assuming supply voltage is 12 volts and total resistance measured from Viso supply to ground return is 8 ohms (e.g. 7.5 ohms motor coil and sense resistance, and 0.5 ohms source drain resistance of devices 94 and 98), current through coil 24 will be a target value of 1.5 amps (Iaccel). Assuming further that the deceleration current (Idecel) is exactly the same as the acceleration current (1.5 amps), if linear mode were used without PWM, the voltage drop across the motor coil 24 and sense resistor R5 will be 11.25 volts (1.5 amps times 7.5 ohms). However, the back EMF voltage (Vbemf) is also present, represented by voltage source 120, and in this example it amounts to 6 volts.

When current flow is reversed, the 6 volts from back EMF source 120 adds to the supply voltage (12 volts) to provide a total of 18 volts (Viso+Vbemf). This voltage is applied across a series path of transistor 90 (Vds90), intrinsic motor resistance (R24), sense resistor R5, and transistor 104 (Vds104) to ground return. The voltage drop across devices 90 and 104 is then as follows:

$$Vds90 + Vds104 = Viso - (R24 + R5)*Idecel + Vbemf,$$
$$= 12\,V - 11.25\,V + 6\,V$$
$$= 6.75\,V.$$

Accordingly, the power dissipation PD of transistors 90 and 104 is then:

$$PD = (Vds90 + Vds104)*Idecel$$
$$= 6.27\,V*1.5\,A$$
$$= 10.125\,Watts.$$

Since the H-bridge driver comprising DMOS transistors 90, 94, 98 and 104 is formed as a single circuit within chip 26, the chip 26 would dissipate this heat at the site of transistors 90 and 104.

FIG. 5B illustrates current flow paths in the H-bridge driver following switch over to the deceleration phase (PWM mode) in accordance with principles of the present invention. In deceleration phase, current flow through the coil 24 is reversed. In this example, pulse width modulation is applied to a gate control electrode of source transistor 90, and sink transistor 104 is turned fully on (triode or linear mode), sinking current to ground return. Accordingly, during initial deceleration phase, current from Viso flows through transistor 90 through the coil 24, the sense resistor R5 and sink transistor 104 to ground return. Transistor 90 is on for an interval, and then off, and is operating in PWM mode. The on- off interval is controlled in order to cause e.g. 1.5 amps (average) current flow through coil 24 during deceleration. Accordingly, a PWM control signal is applied to the gate electrode of the sink device 98, and be inverted by inverter 126. The drive applied to the gate control electrode of device 98 is an inverse of the desired PWM driving signal desired at the gate of transistor 90. When transistor 90 is on, a low source-drain channel resistance (typically not more than 0.3 ohm) will be present. Accordingly, power dissipation at the site of transistor 98 will be considerably reduced.

After the limited duty cycle of sink transistor 90 which follows the PWM control waveform, current flow through source transistor 90 stops. However, current through motor coil 24 will tend to stay constant, because that is the desired condition, and because of the energy stored in the magnetic field of the actuator coil 24. Since current can no longer flow through transistor 90 from Viso, it follows a new path. The new path sources current from ground return through an intrinsic diode 122 of the device 98 to a node 121. In this example, node 121 will fall to a potential below ground return potential. If 1.5 amps passes through diode 122, and if it has a voltage drop of e.g. 1 volt, the device 98 will dissipate approximately 1.5 watts.

In order to off-load some of the dissipation at intrinsic diode 122, it is practical to turn on sink device 98, so that its source-to-drain channel will act as a resistor 124. When turned on, the secondary current path is then through the diode 122 and through the resistor 124, as graphed by the dashed line secondary current flow paths in FIG. 5B. If the channel resistance 124 is low, then it is possible not to turn on the diode 122 at all. If the channel resistance is high, then current flow will be split between the diode 122 and the channel resistance 124. The net effect is that a constant current will flow through the coil 24 (with some ripple).

In order to control the source transistor 90, a simple logic inverter stage 126 may be provided between the gate of the transistor 98 and the gate of the transistor 90, so that an inverse of the PWM control signal applied to control sink transistor 98 is applied to control source transistor 90. Some delay is provided through inverter stage 126 in order to prevent a supply voltage (Viso) to ground direct path through source transistor 90 and sink transistor 98, called a "shoot through" condition.

In the example of the disk drive 10 it is advantageous to isolate the power supply Vcc from the H-bridge circuitry. For that reason, a pass transistor 128 is provided which puts out the isolated power supply Viso, which corresponds to the Vsupply level described above in connection with operation of compensation amplifier 56. When power is lost to the drive 10, the transistor 128 is opened, and prevents loading of the energy stored in the spindle motor 16 from being sourced into other circuit elements of the disk drive 10, or to off-drive circuitry. This is particularly useful where an electronic "return spring" function is implemented in which energy stored in the rotating disk spindle is converted into electricity by the spindle motor, acting as a generator, and applied to the actuator coil 24 to move the actuator structure 18 in a controlled movement to a head parking location relative to the disks 14 (conventionally at an inside radial location, where data storage capacity is smallest, and where starting torque load is also smallest).

Since the DMOS transistors 90, 94, 98 and 104 are similar to NMOS enhancement mode devices, it is necessary to provide boosted control voltages to control the source transistors 90 and 94. An on-chip Vboost supply may generate up to e.g. +24 volts for application to the control gate electrodes of the source devices 90 and 94, to ensure proper control operation.

To those skilled in the art, many changes and modifications will be readily apparent from consideration of the foregoing description of a preferred embodiment without departure from the spirit of the present invention, the scope thereof being more particularly pointed out by the following claims. The descriptions herein and the disclosures hereof are by way of illustration only and should not be construed as limiting the scope of the present invention which is more particularly pointed out by the following claims.

What is claimed is:

1. A voice coil actuator motor (VCM) driver circuit for driving a VCM in a linear mode and in a pulse width modulation (PWM) mode with minimized step disturbance in switching between linear and PWM modes, the VCM driver circuit comprising:

a motor driver input for receiving a motor control signal, a loop compensation amplifier having an inverting input connected to receive the motor control signal from the motor driver input, having a non-inverting input connected to a reference level, and having a loop compensation output providing a maximum clamped control voltage, a differential amplifier pair having a common input connected to the loop compensation output during linear mode and having two outputs connected in series with the coil, and a current sense resistor, each amplifier pair including a current source transistor connected to source current from a supply voltage and a current sink transistor connected to sink current to a ground return path, a feedback amplifier having inputs connected across the sense resistor and having an output connected to the inverting input of the loop compensation amplifier, a pulse width modulation (PWM) generation circuit connected to the loop compensation output for generating variable duty cycle pulses related to the control voltage during a PWM drive mode and for applying the pulses having magnitudes not exceeding the maximum clamped control voltage to a control element of a source or sink one of the transistors, and polarity control means responsive to a driving current direction signal during PWM mode for applying a current direction control signal to control elements of other ones of the transistors, wherein the maximum clamped control voltage provides a boundary for the pulses generated by the PWM generation circuit for minimizing step disturbances in switching between linear and PWM modes.

2. The voice coil actuator motor (VCM) driver circuit set forth in claim 1 wherein the PWM generation circuit comprises:

sawtooth oscillator means for generating a sawtooth waveform having an absolute magnitude not substantially exceeding the maximum clamped control voltage, full wave rectifier means connected to the loop compensation output for rendering the control voltage as an absolute value, and first comparator means connected to compare the absolute value with the sawtooth waveform and for generating a PWM control for directly controlling the source or sink pair of transistors during PWM mode.

3. The voice coil actuator motor (VCM) driver circuit set forth in claim 2 wherein the polarity control means comprises a second comparator connected to compare the control voltage with the reference level, and having a control output, and further comprising an inverter means connected to invert the control output of the source or sink one of the transistors, to provide an inverted control output to a control gate electrode of another one of the transistors during PWM mode.

4. The voice coil actuator motor (VCM) driver circuit set forth: in claim 2 wherein the one transistor of the differential amplifier pair controlled by the PWM generation circuit comprise a current source transistor.

5. The voice coil actuator motor (VCM) driver circuit set forth in claim 1 wherein the motor driver input comprises a digital decoder connected to receive, hold and convert a digital current command value into a raw motor control signal, and a filter for filtering the raw motor control signal to provide the motor control signal.

6. The voice coil actuator motor (VCM) driver circuit set forth in claim 5 wherein the digital decoder comprises a digital to analog converter.

7. A disk drive comprising a storage disk rotated by a disk spindle motor and a voice coil actuator operated by a voice coil actuator motor (VCM) having a single coil, and a motor chip, the motor chip including a control interface for receiving motor control values from drive electronics and for thereupon generating driving signals for operating the spindle motor with a motor driver and current command signals for operating the VCM with a VCM driver, the VCM driver comprising:

four field effect transistors connected to the coil as an H-bridge, a sense resistor in series with the coil and the H-bridge for sensing coil current, a feedback amplifier for amplifying voltage developed across the sense resistor to provide a feedback signal, a VCM driver summing junction for summing current command signals with the feedback signal, a transconductance loop compensation amplifier having an inverting input connected to the VCM driver summing junction, having a non-inverting input connected to a reference level, and having an output control signal node, for providing loop compensation to a control level at the output control signal node, the control level being connected to control linear transconductance differential driver amplifiers including the four field effect transistors during a linear drive mode, pulse width modulation (PWM) generation circuitry connected to the output control signal node for generating variable duty cycle pulses related to the control level during a PWM drive mode and for applying the pulses to control elements of a first one of the four field effect transistors, and polarity control means responsive to a driving current direction signal for applying a control level to control elements of other ones of the four field effect transistors during PWM drive mode.

8. The disk drive set forth in claim 7 wherein the polarity control means comprises a comparator connected to compare the control voltage with the reference level, and having a control output leading to at least one of the other ones of the four field effect transistors during PWM drive mode.

9. The disk drive circuit set forth in claim 7 wherein the first one of the transistors directly controlled by the PWM control comprises a current source transistor.

10. The disk drive circuit set forth in claim 7 wherein the PWM generation circuitry comprises a full wave rectifier circuit connected to remove sign of the control level to yield an absolute control value, a sawtooth generator circuit for generating a sawtooth waveform having an absolute magnitude limited to a maximum clamping voltage level of the control value, and a comparator circuit connected to compare the absolute control value with the sawtooth waveform to generate the variable duty cycle pulses.

11. The disk drive circuit set forth in claim 7 wherein the current command signals are supplied as digital values and further comprising a digital decoder connected to receive, hold and convert the digital values into raw motor control signals, and a filter for filtering the raw motor control signals to provide the motor control signals at the summing node.

12. The disk drive circuit set forth in claim 11 wherein the digital decoder comprises a digital to analog converter.

13. The disk drive circuit set forth in claim 7 wherein the polarity control means comprises a latch within the motor chip control interface for receiving and holding a driving current direction signal from the drive electronics.

14. A method for controlling a voice coil actuator motor (VCM) having a single coil with a VCM motor driver chip within a disk drive, the motor chip including a control interface and an H-bridge driver for generating driving signals for operating the VCM, current sensing means for sensing current flow through a voice coil of the VCM and a transconductance control loop, comprising the steps of:

receiving and decoding VCM control values from disk drive electronics via the control interface, operating the H-bridge driver circuit in a linear mode during track following operations and during an acceleration phase of track seeking operations, switching the H-bridge driver circuit from linear mode to pulse width modulation (PWM) mode at a commanded time to begin a deceleration phase of track seeking operations and without generating a step disturbance in the transconductance control loop, operating the H-bridge driver circuit in pulse width modulation (PWM) mode during a deceleration phase of track seeking operations, and switching the H-bridge driver circuit from PWM mode to linear mode at an end of the deceleration phase without generating a step disturbance in the transconductance control loop.

15. The control method set forth in claim 14, comprising the further steps of:

sensing VCM current at the current sensing means, amplifying and inverting the sensed VCM current to provide a loop error value, combining the loop error value with decoded VCM control values at a loop compensation amplifier to produce a compensated control value, and applying the compensated control value to control the H-bridge driver circuit during linear mode operations.

16. The control method set forth in claim 15, comprising the further steps of:

comparing the compensated control value with a reference to provide a polarity control, controlling the H-bridge during PWM mode with the polarity control, full wave rectifying the compensated control value to produce an absolute command value, generating a sawtooth waveform having an absolute magnitude limited to be not greater than a maximum clamp level of the compensated control value, comparing the absolute command value with the sawtooth waveform to produce width-modulated pulses, and controlling a selected transistor of the H-bridge with the width-modulated pulses during PWM mode.

17. The control method set forth in claim 16, wherein the step of selecting the transistor of the H-bridge to be controlled with the width-modulated pulses during PWM mode comprises the steps of:

applying the width-modulated pulses to a selected other one of the transistors of the H-bridge, inverting the width-modulated pulses to produce inverted control pulses, delaying the inverted control pulses to produce delayed inverted control pulses, and applying the delayed inverted control pulses to control the selected transistor during PWM mode.

18. The control method set forth in claim 15 comprising a further step of actively clamping a maximum value of the compensated control value put out by the loop compensation amplifier to a voltage level related to a power supply voltage level powering the VCM motor driver chip.

* * * * *